(12) United States Patent
McManus

(10) Patent No.: US 6,342,803 B1
(45) Date of Patent: Jan. 29, 2002

(54) PAD DRIVER

(75) Inventor: Michael J. McManus, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/610,592

(22) Filed: Oct. 30, 2000

Related U.S. Application Data

(63) Continuation of application No. 09/052,840, filed on Mar. 31, 1998, now abandoned.

(51) Int. Cl.[7] .................................................. H03K 5/08
(52) U.S. Cl. ........................ 327/318; 327/108; 327/309
(58) Field of Search .............................. 326/21, 30, 56, 326/57, 58, 82, 83, 85, 86, 87; 327/108, 109, 110, 111, 112, 143, 309, 310, 313, 318, 319, 321, 324, 327, 328, 427

(56) References Cited

U.S. PATENT DOCUMENTS

| | | | | |
|---|---|---|---|---|
| 5,391,940 A | * | 2/1995 | Linn | 326/21 |
| 5,528,447 A | * | 6/1996 | McManus et al. | 361/91 |
| 5,684,415 A | * | 11/1997 | McManus | 326/81 |
| 5,852,540 A | * | 12/1998 | Haider | 361/111 |

* cited by examiner

Primary Examiner—Jeffrey Zweizig
(74) Attorney, Agent, or Firm—Chris Maiorana, Esq.

(57) ABSTRACT

The present invention includes a pad driver circuit that has a driver, a power-on circuit coupled to the driver and a power-off circuit coupled to the driver. The power-on circuit is coupled to a pad via the power-off circuit. The power-on circuit provides a high impedance path between the pad and a power supply, particularly when the power supply is off. The power-off circuit provides a stepped-down voltage to the driver when the voltage signal is received. The driver is an open drain driver that includes series pull-down devices. The pad driver further includes a second power off circuit coupled to the driver. The power-on circuit provides a power supply voltage to the driver when a power supply is on. The power-on device preferably includes an inverter coupled to receive a power supply voltage and a clamp coupled to receive an output of the inverter wherein the clamp provides a voltage responsive to the power supply voltage. In operation, the present invention provides for a pad driver that is tolerant of voltages that are greater than a power supply voltage provided to the pad driver. To that end, the power-off circuit steps down a voltage received from the pad. This stepped down voltage is then provided to the driver. The present invention also provides a high impedance path between the pad and the power supply when the power supply is off and a voltage signal is received from the pad.

12 Claims, 1 Drawing Sheet

PAD DRIVER

This is a continuation of U.S. Ser. No. 09/052,840, filed Mar. 31, 1998, now abandoned.

FIELD OF THE INVENTION

The present invention relates to a pad driver and more particularly to an open drain, active low driver.

BACKGROUND OF THE INVENTION

Computer devices are increasingly using the PCI bus architecture. Integrated circuit designs used with the PCI bus now optionally require to have a pin dedicated to a PCI Management Event (PME) signal. The driver required for this pin is intended to be open drain and active low. This driver has requirements beyond those required for standard open drain signals that are shared between devices that are both powered on and off. One requirement of the driver of the PCI pin is that a voltage applied to a network of integrated circuit pins will not cause damage to any device associated with a pin, especially when that component is not powered. Another requirement is that the device must not pull the PCI pin low unless each pin of the network is asserted, including a state defamed by "D3 cold."

As implied above, any device implementing a PME function must not be damaged when the device is not powered and a PME signal is provided to the PME pin of the device. Also, the PME signal driver of the device that drives the signal must not present a low impedance path to any voltage source when the device is not powered. These requirements ensure that the PME signal network will continue to properly fiction when a mixture of powered and unpowered devices have their PME pins coupled together.

Most commonly available open drain output drivers, even those designed to be 5V tolerant—the drivers are powered by a lesser voltage, such as 3.3V—do not meet the above requirements. For example, FIG. 1 illustrates a typical 5V tolerant open drain driver 100 coupled to a pad 130 and a buffer 140. Open drain driver 100 includes series pull-down devices that are illustrated as transistors 110 and 120. The gate of transistor 110 is tied to the power supply that typically provides 3.3V. Thus, transistor 110 is configured to be on or in a conductive state.

While the power supply is providing a voltage to transistor 110, an incoming voltage provided from pad 130 is divided by transistors 110, 120. As a result, the voltage from pad 130 is not applied across only one device. However, if the power supply is not providing a voltage (powered off), then the entire voltage form pad 130 is applied across transistor 110. In particular, if the voltage from pad 130 is 5V and the gate voltage of transistor 110 is about 0V, then there is a drain to gate voltage drop of 5V-0V. If transistor 110 has a gate oxide that cannot tolerate such a voltage drop, the gate oxide will be damaged.

Accordingly, a need exists for an open drain driver that is tolerant of voltages higher than the power supply of the driver and that will not provide a low impedance path to a voltage source when not powered. The present invention meets this need.

SUMMARY OF THE INVENTION

The present invention includes a pad driver circuit that has a driver, a power-on circuit coupled to the driver and a power-off circuit coupled to the driver. The power-on circuit is coupled to a pad via the power-off circuit. The power circuit provides a high impedance path between the pad and a power supply, particularly when the power supply is off. The power-off circuit provides a voltage to the driver when the voltage signal is received. The driver is an open drains driver that includes series pull-down devices. The pad driver further includes a second power off circuit coupled to the driver.

The power-on circuit provides a power supply voltage to the driver when a power supply is on. The power-on device preferably includes an inverter coupled to receive a power supply voltage and a clamp coupled to receive an output of the inverter wherein the clamp provides a voltage responsive to the power supply voltage.

In operation, the present invention provides for a pad driver that is tolerant of voltages that are greater than a power supply voltage provided to the pad driver. To that end, the power-off circuit steps down a voltage received from the pad. This stepped down voltage is then provided to the driver. The present invention also provides a high impedance path between the pad and the power supply when the power supply is off and a voltage signal is received from the pad.

Numerous other advantages and features of the present invention will become readily apparent from the following detailed description of the invention and the embodiments thereof, from the claims and from the accompanying drawings in which details of the invention are fully and completely disclosed as a part of this specification.

DETAILED DESCRIPTION OF THE PREFERRED EMBODIMENT

Figure 1:
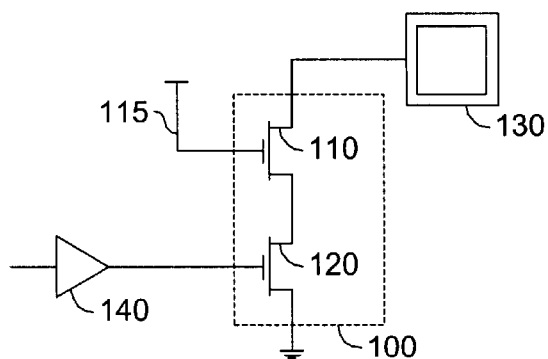
FIG. 1 is a schematic diagram of an open drain, active low driver.

While this invention is susceptible of embodiment in many different forms, there is shown in the drawings and will be described herein in detail a specific embodiment thereof with the understanding that the present disclosure is to be considered as an exemplification of the principles of the invention and is not to be limited to the specific embodiment described.

Figure 2:
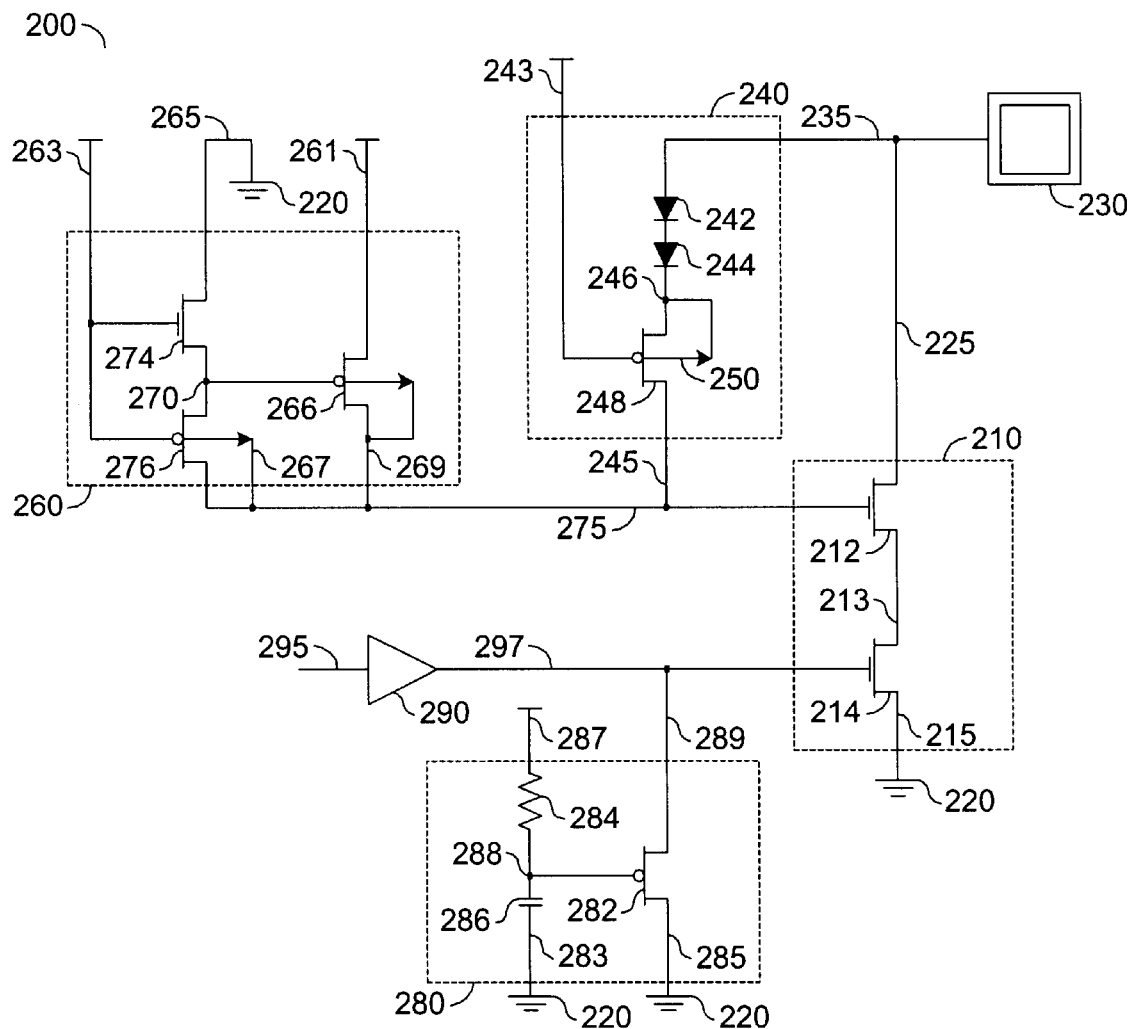
FIG. 2 is a schematic diagram of an open drain, active low driver according to the present invention.

FIG. 2 shows a schematic diagram of a preferred embodiment of the present invention. A pad driver 200 includes a driver 210 coupled to a ground reference 220 via a lead 215, and coupled to a pad 230 via a lead 225. Pad 230 is not included in pad driver 200. Pad driver 200 also includes a power-off circuit 240 that is coupled to pad 230 via a lead 235 and coupled to driver 210 via a lead 245. Power-off circuit 240 is coupled to a power supply via a lead 243.

Pad driver 200 further includes a power-on circuit 260 that is coupled to ground reference 220 via a lead 265 and coupled to driver 210 via leads 267, 269. Power-on circuit 260 is coupled to the power supply via leads 261, 263. Pad driver 200 additionally includes a second power off circuit 280 that is coupled to ground reference 220 via leads 283, 285. Second power off circuit 280 is coupled to the power supply via a lead 287, and is coupled to driver 210 via a lead 289. Driver 210 is coupled to a buffer 290 via a lead 297. A lead 295 couples buffer 290 to receive data input. Buffer 290 is preferably not included in pad driver 200.

Driver 210 preferably includes a transistor 212 having a drain connected to lead 225, a gate connected to a lead 275 and a source connected to a lead 213. A transistor 214 is also included in driver 210. Transistor 214 has a drain connected to lead 213, a gate connected to lead 297 and a source connected to a lead 215. Transistors 212, 214 connected is series form an open drain, active low driver for pad 230.

Power-off circuit 240 preferably includes series connected diodes 242, 244 that are coupled to pad 230 via lead 235. Diode 244 is coupled to a node 246. Also included in power-off circuit 240 is a transistor 248, preferably p-channel, that has a source coupled to node 246, a gate connected to lead 243 and a drain connected to lead 245. Furthermore, it is preferred that the substrate of transistor 248 (represented by reference numeral 250) is tied to the source of transistor 248 at node 246.

Power-on circuit 260 preferably includes a transistor 266, preferably p-channel, having a source connected to lead 261, a gate coupled to a node 270 and a drain connected to lead 269. Also included in power-on circuit 260 are transistors 274, 276 (preferred p-channels). Transistor 274 has a source connected to lead 265, a gate coupled to lead 263 and a drain coupled to node 270. Transistor 276 has a drain coupled to node 270, a gate coupled to lead 263 and a source connected to lead 275. The substrates of transistors 266, 276 are coupled to their respective sources as shown.

Second power off circuit 280 includes a preferred p-channel transistor 282, a resistor 284 and a capacitor 286. Transistor 282 has a source connected to lead 289, a gate coupled to a node 288 and a drain connected to lead 285. Resistor 284 is connected to lead 287 and is coupled to node 288. Capacitor 286 is coupled to node 288 and is connected to lead 283 as shown.

Operation of pad driver 200 will be explained with reference to FIG. 2. For explanation purposes, the ground reference provides 0V, the voltage on pad 230 swings from 0V to 5V, and the power supply provides about 3V when on and about 0V when off. Initially, pad driver 200 is powered down, i.e., the voltage of the power supply is about 0V, and the voltage signal on pad 230 is 0V. In this case, a voltage on lead 275 is no greater than a $V_T$ of a p-channel device, depending on the amount of time that has elapsed since the power supply was turned off.

If a 5V signal is received at pad 230, the 5V is applied to diodes 242, 244 so that the voltage at node 246 is 5V less the voltage drop caused by each diode. For example, each diode can cause about a 0.75V drop, thus the voltage at node 246 will be about 3.5V. Since the power supply is off, the voltage at the gate of transistor 248 is about 0V. With 3.5V provided at the source of transistor 248 by node 246, transistor 248 is turned on. On transistor 248 will provide a voltage on lead 245 of about 3.5V. The voltage on lead 245 will be about 3.5V.

With 3.5V being provided to the gate of transistor 212 from lead 245, and 5V being provided to the drain of transistor 212 by pad 230, there is about a 1.5V drop from drain to gate of transistor 212. As a result, that voltage drop will not damage the gate oxide of transistor 212. Also, since transistor 214 is off—second power off circuit 280 is clamping the gate of transistor 214 to about 0V - and only about 1.5V is being applied to the drain of transistor 214, no gate oxide damage of transistor 214 will occur. As a result, both transistors of driver 210 are tolerant of the 5V voltage signal on pad 230. Furthermore, since transistor 214 is off, pad driver 200 does not provide a low impedance path from pad 230 to ground reference 220.

Before 5V is provided at pad 230, the voltage at the gate and drain of transistor 276 is about 0V. 0V is then applied to the gate of transistor 266. When 5V is provided by pad 230, the voltage on lead 275 increases to about 3.5V. The 3.5V at the source of transistor 276, thee charging of the substrate of transistor 276 from its connection to lead 275 and the 0V at the gate of transistor 276 causes transistor 276 to turn on. On transistor 276 provides 3.5V minus a $V_T$ of transistor 276 to node 270. That voltage is not great enough relative to the voltage on lead 275 to maintain transistor 266 on. Therefore, transistor 266 is turned or maintained off so that the voltage on lead 275 will not sink to the off power supply. In other words, transistor 266 provides a high impedance path between pad 230 and the off power supply coupled to lead 261.

When the power supply is turned on, about 3V is applied to the gate of transistor 274, thereby turning on transistor 274. On transistor 274 pulls node 270 to about 0V, thereby turning on transistor 266. On transistor 266 pulls lead 275 to the voltage of the on power supply, exemplified as about 3V. With 3V at the gate of transistor 212, the gate oxide thereof will not suffer damage regardless of the voltage being applied by pad 230.

Second power off circuit 280, after the power supply 3V is applied to lead 287, requires time to charge capacitor 286. Charged capacitor 286 then turns off transistor 282. As a result, the voltage at the gate of transistor 214 is not clamped to the ground reference voltage. If transistor 212 is on, then a h impedance path is provided between pad 230 and ground reference 220. Transistor 214 will be turned on and off responsive to a signal input on lead 295.

As described, each of transistors 248 and 266 have their substrates coupled to their drains. This provides a current path that loops from the drain, through the substrate and back to drain. If, for example, the substrate was coupled to the power supply that is off, then a parasitic diode between the drain and substrate would be forward biased when a voltage was received from pad 230. The diode would then pass current from the pad to the off power supply. This current path is not desirable.

It will be readily ascertainable to one skilled in the art that the term "about" is constrained by the device characteristics, temperature, applied voltages and time. In other words, given certain constraints, "about" will be some tolerance for the associated voltage. Also, high impedance preferably means a device that conducts less than sub-microampere currents, but can be as high as 10 microamperes. A low impedance device has an on-resistance of less than 10 ohms, but can be a order of magnitude greater.

Numerous variations and modifications of the embodiment described above may be effected without departing from the spirit and scope of the novel features of the invention. It is to be understood that no limitations with respect to the specific device illustrated herein are intended or should be inferred. It is, of course, intended to cover by the appended claims all such modifications as fall within the scope of the claims.

I claim:

1. A pad driver circuit comprising:
   a driver circuit configured to control an impedance between a pad and a ground in response to a signal received at a first input and a voltage received at a second input;
   a power-off circuit configured to (i) present a first high impedance and a first low impedance in a first path between said pad and said second input in response to a power supply being on and off respectively and (ii) isolate said pad from said power supply in response to said power supply being off; and a power-on circuit configured to present a second low impedance and a second high impedance in a second path between said power supply and said second input in response to said power supply being on and off respectively.

2. The pad driver circuit according to claim 1, wherein said power-off circuit comprises:

a plurality of diodes disposed in said first path; and a transistor disposed in said first path and configured to (i) turn on in response to said power supply being off and (ii) turn off in response to said power supply being on.

3. The pad driver circuit according to claim 1, wherein said power-on circuit comprises:

an inverter configured to present (i) a low voltage at a node in response to said power supply being on and (ii) a high voltage at said node in response to said power supply being off; and a transistor disposed in said second path and configured to (i) turn off in response to said high voltage at said node and (ii) turn on in response to said low voltage at said node.

4. The pad driver circuit according to claim 1, further comprising a second power-off circuit configured to (i) clamp said first input to said ground in response to said power supply being off and (ii) isolate said first input from said ground in response to said power supply being on.

5. The pad driver circuit according to claim 4, wherein said second power-off circuit comprises:

a capacitor having a charge;

a resistor configured to increase and decrease said charge in response to said power supply being on and off respectively; and a transistor configured to control an impedance between said first input and said ground in response to said charge.

6. The pad driver circuit according to claim 5, wherein (I) said power-off circuit comprises:

a plurality of diodes disposed in said first path; and a first transistor disposed in said first path, and (II) said power-on circuit comprises:

a second transistor disposed in said second path and having a gate;

a third transistor disposed between said gate of said second transistor and said ground; and a fourth transistor disposed between said gate of said second transistor and said second input.

7. A method of operating a pad driver comprising the steps of:

(A) controlling an impedance between a pad and a ground in response to a signal at a first input and a voltage at a second input;

(B) presenting a first high impedance and a first low impedance in a first path between said pad and said second input in response to a power supply being on and off respectively;

(C) presenting a second low impedance and a second high impedance in a second path between said power supply and said second input in response to said power supply being on and off respectively; and (D) isolating said pad from said power supply in response to said power supply being off.

8. The method according to claim 7, wherein step (B) comprises the sub-steps of:

turning on a transistor disposed in said first path in response to said power supply being off; and turning off said transistor in response to said power supply being on.

9. The method according to claim 7, wherein step (C) comprises the sub-steps of:

presenting a high voltage at a node in response to said power supply being off;

presenting a low voltage at said node in response to said power supply being on;

turning off a transistor in said second path in response to said high voltage at said node; and turning on said transistor in response to said low voltage at said node.

10. The method according to claim 7, further comprising the steps of:

clamping said first input to said ground in response to said power supply being off; and isolating said first input from said ground in response to said power supply being on.

11. The method according to claim 10, further comprising the steps of:

increasing a charge of a capacitance in response to power supply being on;

decreasing said charge in response to said power supply being off; and controlling an impedance between said first input and said ground in response to said charge.

12. A pad driver circuit comprising:

means for controlling an impedance between a pad and a ground in response to a signal at a first input and a voltage at a second input;

means for presenting a first high impedance and a first low impedance in a first path between said pad and said second input in response to a power supply being on and off respectively;

means for presenting a second low impedance and a second high impedance in a second path between said power supply and said second input in response to said power supply being on and off respectively; and means for isolating said pad from said power supply in response to said power supply being off.

* * * * *